United States Patent
Wakao et al.

(10) Patent No.: US 7,552,503 B2
(45) Date of Patent: Jun. 30, 2009

(54) APPARATUS AND METHOD FOR CLEANING A SURFACE WITH HIGH PRESSURE AIR

(75) Inventors: Mitsunobu Wakao, Gifu (JP); Masaki Terai, Aichi (JP); Yukitoyo Ohshima, Gifu (JP)

(73) Assignee: Sony Corporation (JP)

( * ) Notice: Subject to any disclaimer, the term of this patent is extended or adjusted under 35 U.S.C. 154(b) by 592 days.

(21) Appl. No.: 10/879,022

(22) Filed: Jun. 30, 2004

(65) Prior Publication Data

US 2005/0044653 A1    Mar. 3, 2005

(30) Foreign Application Priority Data

Jul. 17, 2003    (JP)   ............................ P2003-275868

(51) Int. Cl.
*A47L 5/38*    (2006.01)
*A47L 15/00*    (2006.01)

(52) U.S. Cl. ........................ 15/302; 15/306.1; 15/309.1; 15/309.2; 15/345; 15/346; 134/1; 134/10; 134/30; 134/36; 134/37

(58) Field of Classification Search ................... 15/1.51, 15/302, 345, 306.1, 309.2, 309.1, 346; 134/1, 134/10, 30, 36, 37

See application file for complete search history.

(56) References Cited

U.S. PATENT DOCUMENTS

| | | | | |
|---|---|---|---|---|
| 3,078,496 | A | * | 2/1963 | Doran et al. ............... 15/309.1 |
| 4,659,014 | A | * | 4/1987 | Soth et al. ................. 239/102.2 |
| 5,381,580 | A | * | 1/1995 | Kotitschke et al. .......... 15/309.1 |
| 5,388,304 | A | * | 2/1995 | Takada ........................ 15/345 |
| 5,457,847 | A | * | 10/1995 | Uzawa et al. ................. 15/345 |
| 5,490,300 | A | * | 2/1996 | Horn ........................... 15/1.51 |
| 5,800,679 | A | * | 9/1998 | Lindstrom et al. ............ 15/345 |
| 5,916,373 | A | | 6/1999 | Schneider |
| 6,474,355 | B1 | * | 11/2002 | Jirawat et al. .............. 15/306.1 |

(Continued)

FOREIGN PATENT DOCUMENTS

JP    62-151990 U    9/1987

(Continued)

OTHER PUBLICATIONS

JP Search Report; Application No. 2003-275868; Dated: May 22, 2007.

*Primary Examiner*—Joseph J Hail, III
*Assistant Examiner*—Shantese McDonald
(74) *Attorney, Agent, or Firm*—Rader Fishman & Grauer PLLC; Ronald P. Kananen (57) ABSTRACT

A cleaning apparatus and method which includes spraying high pressure air obliquely onto a cleaning surface from an air nozzle disposed in the vicinity of the cleaning surface of a cleaning object to be cleaned. A recovery portion of the cleaning apparatus which is disposed in front of an outlet port of the air nozzle recovers at least air containing foreign matter removed from the cleaning object by making the air exhaust into an exhaust introducing passage along a wall surface of an air guide. The recovery portion of the cleaning apparatus includes an air guide section disposed in front of the outlet port of the air nozzle, and an air cover section, which forms an exhaust introducing passage for recovering the air that flows along an air guide wall surface of the air guide section.

19 Claims, 4 Drawing Sheets

U.S. PATENT DOCUMENTS 7,047,984 B2 * 5/2006 Blattner et al. .................. 134/1

FOREIGN PATENT DOCUMENTS

| JP | 1989-034458 | 2/1989 |
| JP | 07-275746 | 10/1995 |
| JP | 09-321013 | 12/1997 |
| JP | 10-505276 | 5/1998 |
| JP | 10-290964 | 11/1998 |
| JP | 2000-271551 | 10/2000 |
| JP | 2001-021899 | 1/2001 |
| JP | 2001-196345 | 7/2001 |
| JP | 2002-310454 | 10/2002 |
| JP | 2002-316110 | 10/2002 |
| JP | 2003-145062 | 5/2003 |
| JP | 2003-200121 | 7/2003 |

* cited by examiner

APPARATUS AND METHOD FOR CLEANING A SURFACE WITH HIGH PRESSURE AIR

CROSS REFERENCE TO RELATED APPLICATIONS

The present document is based on Japanese Priority Document JP2003-275868, filed in the Japanese Patent Office on Jul. 17, 2003, the entire contents of which are incorporated herein by reference.

BACKGROUND OF THE INVENTION

1. Field of the Invention

The present invention relates to a cleaning apparatus and a cleaning method, which remove and recover foreign matter or dust, liquid and the like from a cleaning object to be cleaned by spraying, for example, high-pressure air onto the cleaning object. Particularly, the present invention relates to a dust removing technique utilizing the Coanda effect to make the recovery of the air containing the removed dust and the like into an exhaust-introducing passage along a wall surface.

2. Description of the Related Art

Conventionally, a number of techniques have been proposed as the technique for removing dust from a cleaning object. For example, in Japanese Patent Application Publication No. 2000-271551 (page 2, FIG. 1), there is proposed a method for removing liquid adhered to an object in which when removing liquid adhered to a steel plate by spraying compressed gas, an ultrasonic nozzle is used to apply ultrasonic waves to the air and spray on it. Further, in Japanese Patent Application Publication No. HEI7-275746 (page 4, FIG. 1), there is proposed a cleaning apparatus for removing deposits adhered to a cleaning surface of an object by spraying high pressure gas onto the cleaning surface of the object while supplying a cleaning solution that is made into particles by applying ultrasonic vibration to a sprayed region of the high-pressure gas.

However, none of the techniques described in Japanese Patent Application Publication No. 2000-271551 and Japanese Patent Application Publication No. HEI7-275746 are equipped with a mechanism for recovering the removed deposit. For this reason, there are environmental problems such that the removed deposit readheres to the cleaning object, and of the area around the cleaning apparatus become dirty.

Therefore, there also is proposed a cleaning apparatus equipped with a mechanism for recovering the removed deposit. A cleaning apparatus of Japanese Patent Application Publication No. 2002-316110 (page 3, FIG. 1) prevents dust from readhereing to a cleaning object by spraying compressed gas, to which ultrasonic vibration has been applied, and sucking the removed dust through a suction nozzle. Further, a cleaning apparatus of Japanese Patent Application Publication No. 2001-21899 (pages 3 and 4, FIG. 1) removes dust by applying ultrasonic vibration to the air sprayed onto a substrate that is a cleaning object, and sucks and recovers the removed dust, thereby preventing the dust from readhereing to the substrate.

Figure 1:
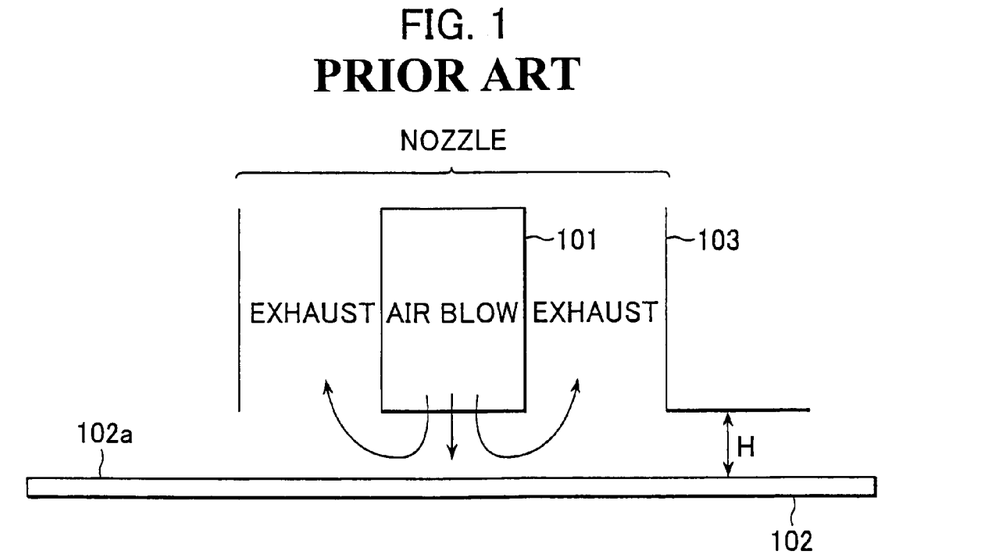
FIG. 1 is a schematic block diagram of a conventional cleaning apparatus.

In FIG. 1, there also is proposed a cleaning apparatus in which an air nozzle 101 for spraying high pressure air is disposed adjacent to a cleaning surface 102a of a mounting substrate 102 to mount an electronic component thereon, for example, and an exhaust nozzle 103 of a dust collector to recover the dust removed from the cleaning surface 102a by the high-pressure air (air blow) blown from the air nozzle 101 to the cleaning surface 102a is disposed so as to surround the air nozzle 101, in order to vacuum and recover the removed dust through the exhaust nozzle 103.

Any of the cleaning apparatuses shown in these patent documents land 2, and in FIG. 1 prevents leakage of high-pressure air by disposing the air nozzle 101 for blowing high-pressure air so as to be substantially perpendicular with respect to the mounting substrate 102 that is a cleaning object.

SUMMARY OF THE INVENTION

All the cleaning apparatuses shown in the patent documents 1 and 2 and in FIG. 1, have a structure in which the removed dust is sucked and exhausted to the outside by a dust collector by means of a large-capacity vacuum. It is thus considered that the removed dust may be scattered to the work environment when the dust collector is stopped or, depending on maintenance situations, fails to accomplish a complete recovery of the dust.

In addition, all of the above-mentioned cleaning apparatuses have difficulty retaining the effect of dust collection unless the air nozzle 101 and the mounting substrate 102 as a cleaning object are disposed extremely adjacent so as to have a distance H therebetween of about 1 mm to 2 mm and the air nozzle 101 is disposed at an approximately right angle with respect to the mounting substrate 102. Therefore, the apparatus adjusting operation is time-consuming. If the distance H is 5 mm or more, the suction force of the dust collector may be varied, and air blow leaks to the outside, failing to function as a cleaner. Additionally, with these cleaning apparatuses, it is difficult to clean a cleaning object having on its surface swells or irregularities of 1 mm to 2 mm or more.

In addition, with these cleaning apparatuses, liquid that is adhered to a cleaning object cannot be removed by the use of a large dust collector by means of vacuum, and they require a large apparatus installation area and a high level of plant investment and running costs, such as electric and high maintenance. Further, since the exhaust nozzle 103 is required in the area surrounding the air nozzle 101, the apparatus shape of a cleaning object mounting portion becomes large. Furthermore, since the dust collector is used, it is difficult to use this cleaning apparatus under an operational environment in the presence of explosive gas.

Alternatively, instead of the method for spraying high pressure air onto a cleaning object, there is also a cleaning method for having a sticky roller contact a cleaning surface of a cleaning object. However, the dust that is adhered to a sticky matter readheres to the cleaning object, or it is impossible to remove liquid with this method.

The present invention has been made under the above-described circumstances to provide a cleaning apparatus and a cleaning method at low cost, and which are able to remove not only dust but also liquid, while preventing the readherence of dust to a cleaning object, so that cleaning is performed without requiring a dust collector which uses a vacuum or the like.

A cleaning apparatus of the present invention includes air supply means for spraying high-pressure air from an air nozzle onto the cleaning surface of a cleaning object to be cleaned and recovery means for recovering air containing foreign matter or dust removed by the spraying of the high pressure air. The air nozzle is disposed in the vicinity of the cleaning surface of the cleaning object, and the high-pressure air is sprayed obliquely onto the cleaning surface. The recovery means is disposed in front of an outlet port of the air nozzle and recovers the air containing the removed dust by making the air exhaust into an exhaust introducing passage along the wall surface of an air guide.

As described above, in accordance with the cleaning apparatus of the present invention, the recovery means for recovering the air containing the dust removed by spraying the high pressure air is disposed in front of the outlet port of the air nozzle, and it is constructed such that the air containing the dust removed is exhausted into the exhaust introducing passage along the wall surface of the air guide of the recovery means. It is therefore able to remove the dust from the cleaning object in a simple structure, without using a dust collector by means of vacuum, which is expensive and requires a large installation area.

A cleaning method of the present invention is to spray high pressure air obliquely from an air nozzle disposed in the vicinity of a cleaning surface of a cleaning object to be cleaned and recover the air containing the dust removed from the cleaning surface by making the air exhaust into the exhaust introducing passage along the wall surface of the air guide of recovery means disposed in front of an outlet port of the air nozzle.

In accordance with the cleaning method of the present invention, when high pressure air is sprayed obliquely onto the cleaning surface of the cleaning object, deposits such as dust and liquid adhered to the cleaning surface are removed by the high pressure air. The air containing the removed deposits is exhausted by the Coanda effect into the exhaust introducing passage along the wall surface of the air guide of the recovery means disposed in front of the air nozzle and then recovered.

In accordance with the cleaning apparatus of the present invention, there is used the recovery means of simple structure that makes the deposit removed to be exhausted into the exhaust introducing passage along the wall surface by utilizing the Coanda effect and recovered. It is therefore able to attain a reduction in plant investment, running cost, and maintenance cost, and it is also able to considerably reduce the apparatus installation space.

In accordance with the cleaning method of the present invention, it is able to remove the deposit of the cleaning object by high pressure air, and it is also able to, by the Coanda effect, exhaust all of the air containing the removed deposit into the exhaust-introducing passage and recover them without scattering it to the surroundings, thereby preventing readherence of the deposit to the cleaning object. As a result, it is able to reduce considerably defective products caused by dust, thus enablinging improvement in productivity.

The present invention is applicable to the technique of removing dust and the like adhered to, for example, a semiconductor wafer and an LCD substrate by the spraying of high pressure air, and recovering the air containing the removed dust.

BRIEF DESCRIPTION OF THE DRAWINS

DESCRIPTION OF THE EMBODIMENTS

Specific embodiments to which the present invention is applied will be described in detail by referring to the drawings.

[Configuration of Cleaning Apparatus]

Figure 2:
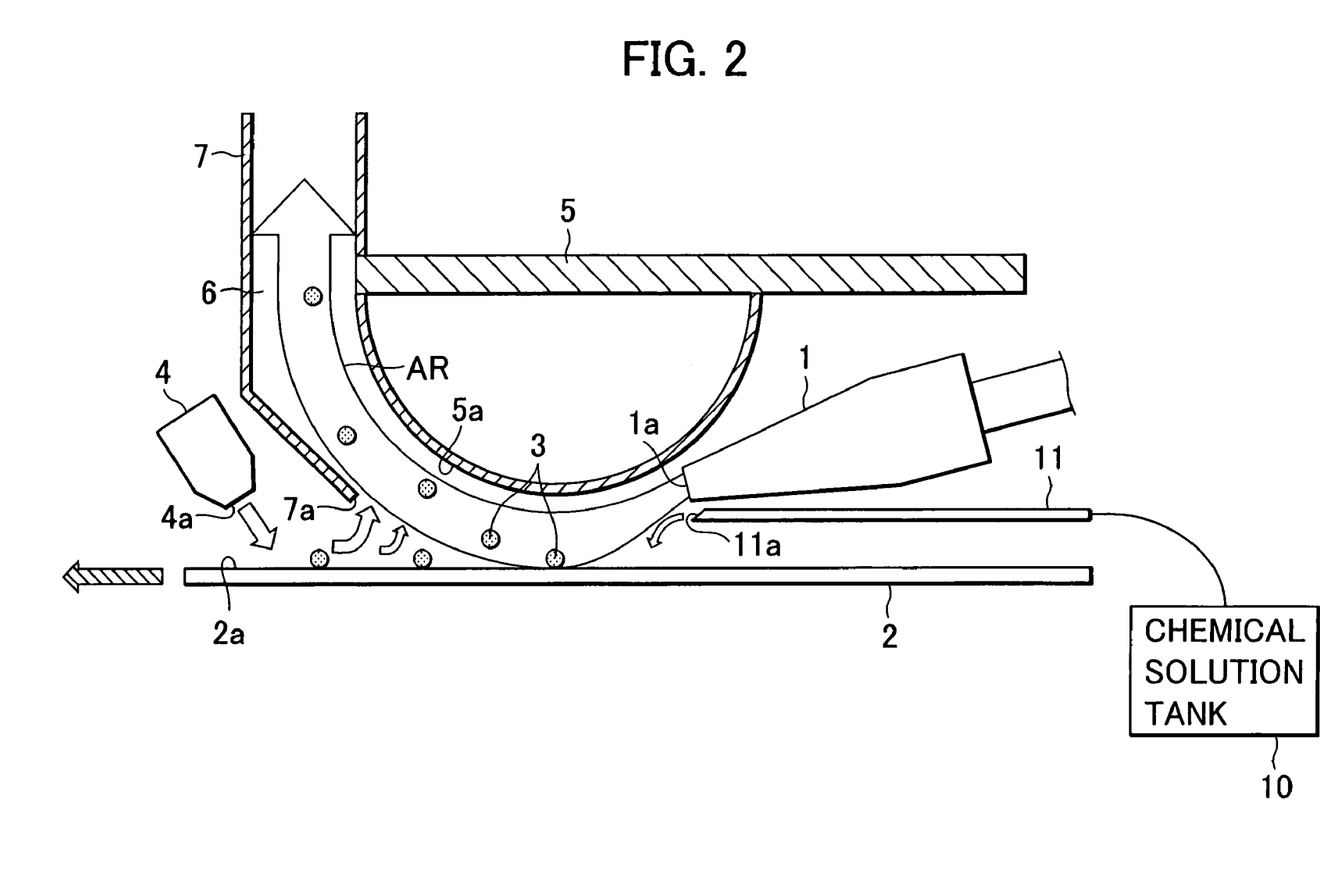
FIG. 2 is a schematic block diagram of a cleaning apparatus in an embodiment of the present invention.

A cleaning apparatus of this embodiment includes, as shown in FIG. 2, air supply means for spraying high pressure air from an air nozzle 1 obliquely onto a cleaning surface 2a of a cleaning object 2 to be cleaned; recovery means, disposed in front of an outlet port of the air nozzle 1, for recovering air, AR, containing deposit 3 removed from the cleaning object 2; ultrasound generating means for applying ultrasound waves to high pressure air sprayed onto the cleaning object 2; static electricity eliminating means having a static electricity eliminating nozzle 4 for eliminating static electricity charged on the cleaning surface 2a; and chemical solution supply means for spraying a chemical solution, such as a surface protection coating solution and a static electricity charge preventing solution, onto the cleaning surface 2a of the cleaning object 2.

The air supply means is configured to supply high pressure air from a compressor, of which a depiction is omitted, to the air nozzle 1, so as to spray the high pressure air through an outlet port 1a of the air nozzle 1 onto the cleaning object 2. The high pressure air blown from the air nozzle 1 preferably has a spouting pressure of about 3 to 5 $kg/cm^2$ and a spouting velocity of about 25 to 30 m/s.

The air nozzle 1 is not perpendicular to the cleaning surface 2a of the cleaning object 2, and it is disposed obliquely relative to the cleaning surface 2a. The angle formed by the air nozzle 1 and the cleaning surface 2a (hereinafter referred to as a "spray angle") is preferably 5 degrees to 45 degrees. If the above-mentioned spray angle is less than 5 degrees, the air sprayed onto the cleaning surface 2a is reduced, failing to obtain a sufficient cleaning effect. If it exceeds 45 degrees, the efficiency of dust recovery by the Coanda effect decreases.

The spray angle of the above-mentioned air nozzle 1 is changeable arbitrarily in the above-mentioned angle range, and is adjusted depending on the type of deposit 3 adhered, and the like. The cleaning object 2 to be cleaned is a substrate, such as a mounting substrate to mount components thereon, a silicon wafer, a liquid crystal display (LCD) panel, a field emission display (FED) panel, a plasma display panel (PDP), a multifunction film, as well as paper, a PET bottle, and the like. As deposit 3, there are foreign matter or dust having size, for example, about several nm to several μm, such as substrate cutting scrap and lint, and liquid.

From the facts that the air nozzle 1 is disposed obliquely relative to the cleaning surface 2a and the recovery means for recovering the air containing the removed deposit 3 is disposed in front of the outlet port 1a of the air nozzle 1, it is able to ensure a larger distance between the air nozzle 1 and the cleaning object 2 than the case in which an air nozzle is disposed perpendicularly, for the reason to be described later. For example, the distance between the air nozzle 1 and the cleaning object 2 can be about 5 to 10 mm. If such a distance can be ensured, even when there are irregularities of not less than 1 to 2 mm or more and swells on the cleaning surface 2a of the cleaning object 2, the cleaning object can be cleaned with the cleaning apparatus in this embodiment.

The recovery means for recovering the air, AR, containing the removed deposit 3 is configured by an air guide section 5 disposed in front of the outlet port 1a of the air nozzle 1 and an air cover section 7, which forms an exhaust introducing passage 6 for recovering the air, AR, that flows along an air guide wall surface 5a of the air guide section 5.

The air guide section 5 is formed as a semicircle-like guide wall projecting downwardly. The air guide section 5 has the air guide wall surface 5a of a circular arc, and it allows the exhaust of the air, AR, containing the deposit 3, which is removed by spraying from the air nozzle 1 onto the cleaning surface 2a, into the exhaust introducing passage 6 along the air guide wall surface 5a. This is derived from the Coanda effect. The Coanda effect means the wall effect of generating air flow along a wall.

The air cover section 7 is formed along the air guide wall surface 5a in correspondence to a position equivalent to the left, halfway from the center of the air guide section 5, so that it forms the exhaust introducing passage 6 with the air guide wall surface 5a. An opening end 7a of the air cover section 7 extends to a position adjacent to the cleaning surface 2a of the cleaning object 2. The exhaust introducing passage 6 is connected to an exhaust section, of which a depiction is omitted. The exhaust section is constructed to recover the air AR containing the removed deposit 3.

Figure 3:
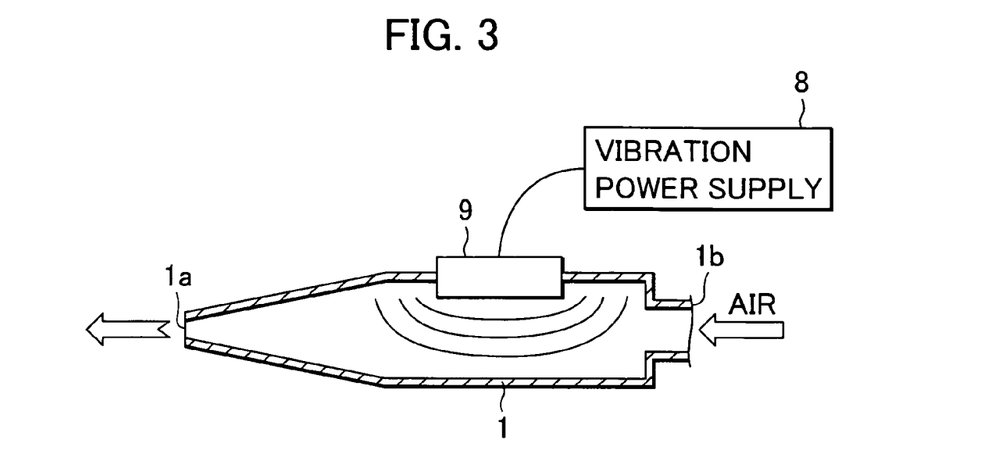
FIG. 3 is a sectional view of an air nozzle of a structure in which an ultrasonic vibrator is adhered in the air nozzle.

The ultrasound generating means is to apply ultrasonic waves to high pressure air to be sprayed onto the cleaning object 2, and it is constituted by an ultrasonic vibration power supply 8 and an ultrasonic vibrator 9. The ultrasonic vibrator 9 is fixed to the air nozzle 1, and it vibrates on receipt of an arbitrary ultrasonic frequency vibrated from the ultrasonic vibration power supply 8. Upon receipt of the ultrasonic waves, the air introduced through an air supply port 1b into the air nozzle 1 is vibrated by the ultrasonic vibrator 9. Within the air nozzle 1, the ultrasonic waves are propagated into the high pressure air released from the outlet port 1a of the air nozzle 1.

The ultrasonic waves propagating into the high pressure air is preferably about 20 to 400 KHz, for example. If the frequency is less than 20 KHz, compression waves have difficulty occurring in the air, and the efficiency of removing the deposit 3 is lowered. On the other hand, if the frequency exceeds 400 KHz, more improvement of the removing effect cannot be expected.

Thus, when high pressure air, which is the high pressure air blown from the outlet port 1a of the air nozzle 1 into which ultrasonic waves have been propagated, is sprayed onto the cleaning surface 2a of the cleaning object 2, compression waves occur in the air, thereby increasing the efficiency of removing the deposit 3 such as dust and liquid adhered to the cleaning surface 2a.

The static electricity eliminating means (static electricity air blow apparatus) is to eliminate the static electricity generated when high pressure air makes contact with the cleaning surface 2a, and the static electricity eliminating nozzle 4 is disposed in the spray direction of the air nozzle 1, as shown in FIG. 2. The static electricity eliminating nozzle 4 is disposed at a portion proximate to the cleaning surface 2a of the cleaning object 2, which portion corresponds to a position toward the opening end 7a of the air cover section 7. An outlet port 4a of the static electricity eliminating nozzle 4 is directed in an opposite direction to the spray direction of high pressure air blown from the air nozzle 1, such that static electricity eliminating air is blown obliquely to the cleaning surface 2a.

The chemical solution supply means is, as shown in FIG. 2, composed of a chemical solution tank 10 for storing chemical solutions such as a surface protection coating solution for coating the cleaning surface 2a of the cleaning object 2, and a static electricity charge preventing solution for preventing static electricity from charging on the cleaning surface 2a, and a chemical solution supply nozzle 11 through which the chemical solution from the chemical solution tank 10 is blown to join with the high pressure air blown from the air nozzle 1.

The chemical-solution supply nozzle 11 is constituted by a long narrow tube, and a discharge port 11a through which the chemical solution is discharged is disposed adjacent to the outlet port 1a of the air nozzle 1. By the suction force of high-pressure air blown from the air nozzle 1, the chemical solution discharged from the chemical-solution supply nozzle 11 is diffused and expands in its mist state into this high-pressure air, so that the chemical solution is supplied over the entire cleaning surface 2a.

[Cleaning Method]

To remove the deposit 3, such as dust and liquid adhered to the cleaning object 2, by using the above-mentioned cleaning apparatus, the cleaning method is performed as follows. First, liquid that assists in the prevention of static electricity charging and in removal of dust is poured into the tank 10, and is discharged from the discharge port 11a of the chemical-solution supply nozzle 11. When discharging the chemical solution, high pressure air is blown from the outlet port 1a of the air nozzle 1 so as to have the high pressure air suck the chemical solution.

Since the chemical-solution supply nozzle 11 is disposed adjacent to the air nozzle 1, it is under a more negative pressure than the chemical solution tank 10, so that the chemical solution (the liquid that assists in prevention of static electricity charging and in removal of dust) is sucked by the high-pressure air. As a result, the chemical solution is brought into its mist state and uniformly applied throughout the entire cleaning surface 2a of the cleaning object 2. Applying the liquid that assists in prevention of static electricity charging and in removal of dust improves the removing effect for dust, by which it is able to remove static electricity causing adherence of dust and the like.

Next, by the ultrasonic vibration power supply 8, the ultrasonic vibrator 9 is vibrated to cause ultrasonic waves in the air nozzle 1, and the ultrasonic waves are applied to high pressure air. Then, the high pressure air applied with the ultrasonic waves is blown through the outlet port 1a of the air nozzle 1 onto the cleaning object 2. At this time, since the high pressure air is sprayed obliquely onto the cleaning surface 2a of the cleaning object 2, the flow velocity at the time of blow can be maintained until the time of discharge. In addition, since the distance between the outlet port 1a of the air nozzle 1 and the cleaning object 2 can be retained as much as about 5 to 10 mm, the arrangement adjusting operation of the air nozzle 1 is able to be simplified, and cleaning is possible even when there are some irregularities and swells on the cleaning surface 2a.

When high pressure air applied with ultrasonic waves are blown from the air nozzle 1, compression waves occur in the high pressure air, and the deposit 3 adhered to the cleaning surface 2a of the cleaning object 2 is shaken by the compression waves. As a result, the deposit 3 is susceptible to separation from the cleaning face 2a. In other words, the deposit 3 adhered to the cleaning surface 2a is susceptible to separation from the adhesive strength on the cleaning surface 2a because force is exerted thereon from two or more directions, and is therefore readily removable. Objective dust for which a cleaner effect is noticeable is dust of not more than 100 μm in size.

The air, AR, containing the deposit 3 removed from the cleaning surface 2a by the high pressure air runs by Coanda effect along the air guide wall surface 5a of the air cover section 7, passes through the exhaust introducing passage 6 formed by the air cover section 7, and then is discharged to the exhaust section. At this time, the chemical solution that has been expanded in its mist state and uniformly applied to the cleaning surface 2a is also recovered together with the air, AR. Further, by applying the high pressure air, of which flow velocity is increased in the air nozzle 1, from a position extremely close to the cleaning object 2, the removing effect to the deposit 3 is increased, and, by this flow velocity, the Coanda effect can be generated efficiently to recover the deposit 3.

Thus, in accordance with the present invention, the air, AR, containing the deposit 3 that has been removed by the blow effect derived from the high-pressure air of high flow velocity and by the removing effect of the deposit 3 derived from ultrasonic waves is then discharged into the exhaust introducing passage 6 with a negative pressure, which is generated at a proximate portion of the opening end 7a of the air cover section 7 by vacuum effect, by which the surrounding air is also sucked in by the high pressure air flow at the time of discharge. By this vacuum effect, the deposit 3 adhered to the cleaning surface 2a can be removed, thereby enabling the removing effect to the deposit 3 to increase.

Therefore, from the fact that all of the air, AR, containing the deposit 3 removed from the cleaning surface 2a of the cleaning object 2 can be exhausted into the exhaust section through the exhaust introducing passage 6, the cleaning apparatus is able to remove and discharge the deposit 3 and the air AR containing the deposit 3 without causing them to be scattered into a work environment. Accordingly, it is able to attain a large reduction in defective parts during an electronic parts assembly in which a contaminant causes a critical functional discrepancy due to the structural features thereof, for example, LCD panels and FED panels, and an improvement in productivity. Alternatively, in the case where paper, film, PET bottles, etc. are taken as a cleaning object 2, although the presence of a contaminant on a label surface can cause poor printing, it is able to attain a large reduction of defectives and an improvement of productivity by using the cleaning method of the present invention.

In addition, in accordance with the cleaning apparatus of the present invention, there is provided 100% or approximately 100% recovery of the high pressure air blown from the air nozzle 1, without causing the deposit 3 to scatter to the surroundings, thus permitting use in a clean room environment. Therefore, the cleaning apparatus is able to attain a considerable reduction of plant investment, a running cost reduction, and a maintenance cost reduction. In addition, since there is no mechanical/electrical moving part, as in a dust collector by means of a vacuum or the like, there are no spark and temperature generating parts. As a result, even in the case where an operational step under an explosive atmosphere is included in the manufacturing steps of a semiconductor device or the like, the removal of dust is possible by the application of the cleaning apparatus of the present invention, so that an improvement in productivity and a process improvement are realized.

OTHER EMBODIMENTS

Figure 4:
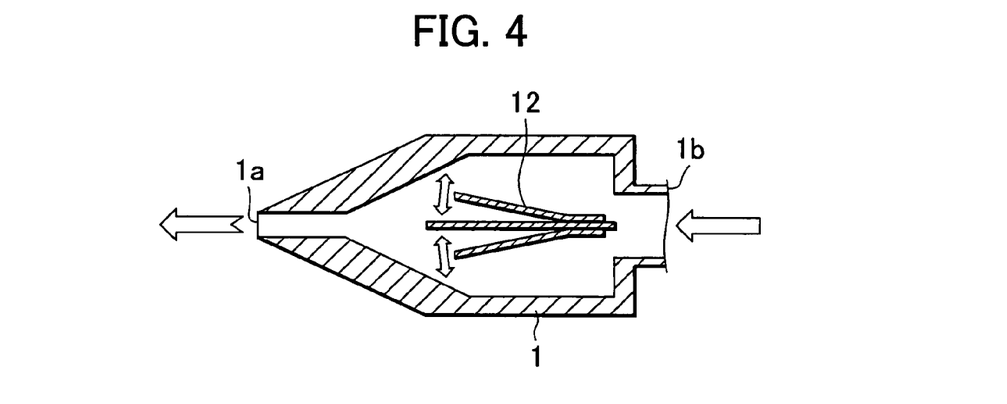
FIG. 4 is a sectional view of an air nozzle of a structure in which a diaphragm is disposed in the air nozzle.
Figure 5:
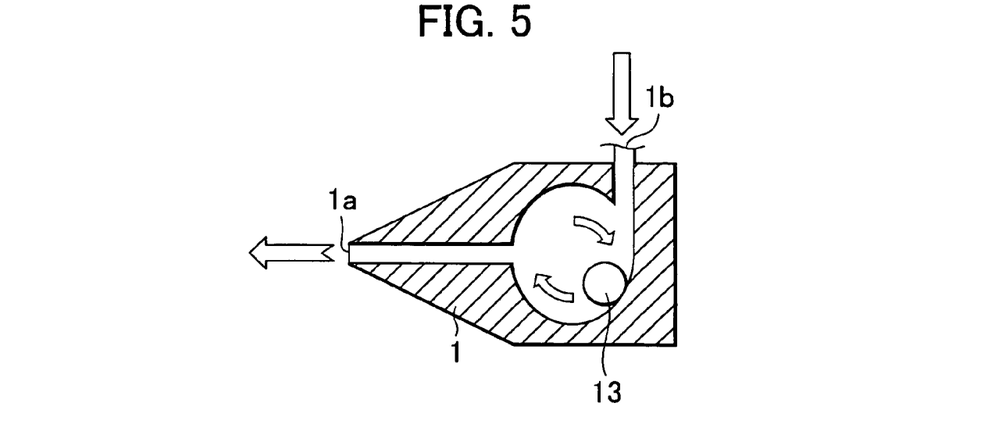
FIG. 5 is a sectional view of an air nozzle of a structure in which an vibrator is disposed in the air nozzle.

In the foregoing embodiments, the structure is one in which the ultrasonic vibrator 9 is disposed in the air nozzle 1 and an arbitrary ultrasonic frequency is generated by the ultrasonic vibration power supply 8; however, in addition to it, as shown in FIG. 4, a diaphragm 12 may be disposed in the air nozzle 1 so as to generate ultrasonic waves by causing the diaphragm 12 to be vibrated by the air introduced into the air nozzle 1. Alternatively, as shown in FIG. 5, an vibrator 13 may be rotated in a chamber by air so as to have the main body of the air nozzle 1 vibrate to generate ultrasonic waves. In FIG. 4 and FIG. 5, an optimum ultrasonic frequency can be generated by suitably selecting the material and the size of the diaphragm 12 and the vibrator 13.

Figure 6:
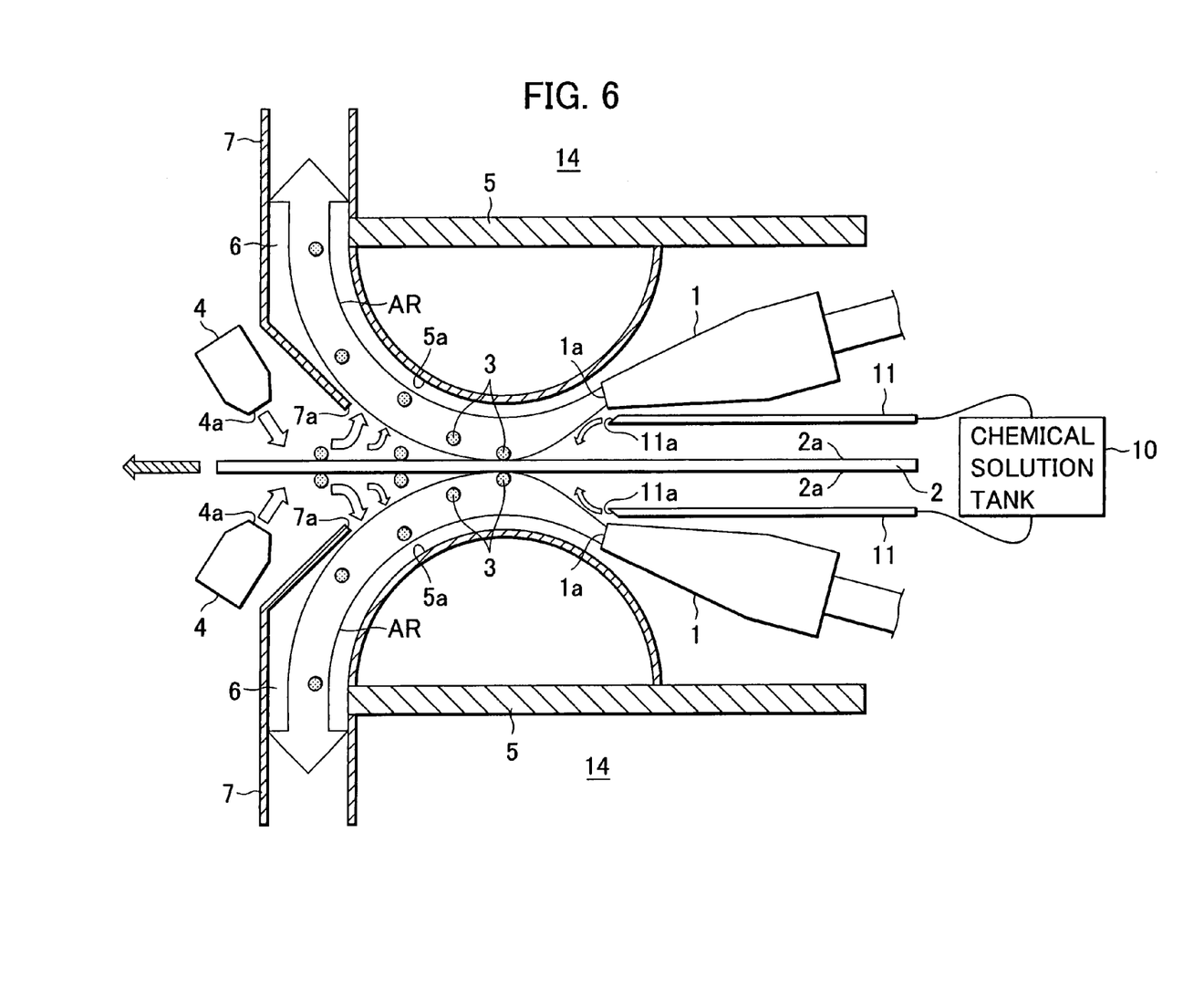
FIG. 6 is a schematic block diagram of a cleaning apparatus showing an example of disposing a cleaning unit on both surfaces of a cleaning object.

Besides this, as shown in FIG. 6, a cleaning unit 14 including air supply means, recovery means, ultrasound generating means, static-electricity eliminating means and chemical-solution supply means may be disposed on both sides of a cleaning object 2, respectively. Thus, if the cleaning unit 14 is disposed on both sides of the cleaning object 2, it is able to remove concurrently deposit 3, such as dust and liquid adhered to the cleaning surfaces 2a of the cleaning object 2.

In FIG. 2, if an auxiliary air nozzle is disposed at the position where the static electricity eliminating nozzle 4 is disposed, the air blow effect will be able to double. At this time, all of the air blow from the auxiliary air nozzle and dust can be recovered by the vacuum effect of the main nozzle.

Also, in FIG. 2, although the air guide wall surface 5a is of a semicircular shape, the air guide wall surface 5a may be formed in a complex arc shape or the like, depending on the type of the cleaning object 2 and the type of dust.

Additionally, in the present invention, even if the cleaning surface 2a of the cleaning object 2 faces upwardly, downwardly, or sidewardly, it can be cleaned by the air nozzle 1.

Finally, the embodiments described above are only examples of the present invention. It should be noted that the present invention is not restricted only to such embodiments and examples, and various modifications, combinations and sub-combinations in accordance with its design or the like may be made without departing from the scope of the present invention.

What is claimed is:

1. A cleaning apparatus comprising:
   air supply means for spraying high pressure air obliquely onto a cleaning surface to remove deposits on said cleaning surface by the high pressure air from an air nozzle disposed in the vicinity of said cleaning surface of a cleaning object to be cleaned;
   recovery means, including an air guide section disposed in front of an outlet port of said air nozzle, and an air cover section defining an air guide wall surface of an exhaust introducing passage for recovering substantially all of the air containing the removed deposits from said cleaning object by causing said air to exhaust, using a Coanda effect with said air guide wall surface, into said exhaust introducing passage along a wall surface of the air guide wall surface without exhausting the air and the removed deposit to surroundings; and further characterized as not requiring an external vacuum source for said exhaust introducing passage,
   ultrasound generating means for applying an ultrasonic wave to said high pressure air to be sprayed onto said cleaning object; and
   static electricity eliminating means, provided in the vicinity of said cleaning surface, for eliminating static electricity charged on said cleaning surface.

2. The cleaning apparatus according to claim 1, further comprising:
   chemical solution supply means including a chemical solution supply nozzle disposed in the vicinity of said air nozzle for spraying a chemical solution from said chemical solution supply nozzle onto said cleaning surface of said cleaning object, said chemical solution including at least a surface protection coating solution and a static electricity charge preventing solution.

3. The cleaning apparatus according to claim 1, wherein said ultrasound generating means includes an ultrasonic vibrator, and wherein the ultrasonic wave is generated by the ultrasonic vibrator disposed in the air nozzle.

4. The cleaning apparatus according to claim 1, wherein the ultrasound generating means is a diaphragm disposed in the air nozzle.

5. The cleaning apparatus according to claim 1, wherein the ultrasound generating means is a vibrator which is rotated in a chamber disposed in the air nozzle.

6. The cleaning apparatus according to claim 1, wherein said air nozzle is located about 5 to 10 mm from said cleaning surface, said high pressure air is blown from said air nozzle at about a spouting pressure of 3 to 5 kg per square centimeter at a spouting velocity of about 25 to 30 m/s.

7. The cleaning apparatus according to claim 1, wherein said air guide air surface is a semicircle-like guide wall projecting toward said air nozzle.

8. The cleaning apparatus according to claim 1, wherein the air guide section has the air guide wall surface of a circular arc for generating an air flow along said air guide wall into said exhaust introducing passage.

9. A cleaning method comprising the steps of:
spraying high pressure air obliquely onto a cleaning surface from an air nozzle disposed in the vicinity of said cleaning surface of a cleaning object to be cleaned to remove deposits by the high pressure aid;
recovering substantially all of said air containing the removed deposits from said cleaning object by causing said air to exhaust, using a Coanda effect, into an exhaust introducing passage along an air guide wall surface of an exhaust introducing passage of an air recovery means disposed in front of an outlet port of said air nozzle without exhausting the air and removed deposits to a surrounding; said recovering step characterized as being carried out without need for an external vacuum source for said exhaust introducing passage;
wherein an ultrasonic wave is applied to said high pressure air, and
wherein air for eliminating static electricity is sprayed onto said cleaning surface of said cleaning object.

10. The cleaning method according to claim 9, wherein a chemical solution is discharged from a chemical solution supply nozzle provided in the vicinity of said air nozzle in conjunction with spraying of said high pressure air.

11. The cleaning method according to claim 9, wherein the ultrasonic wave is generated by an ultrasonic vibrator disposed in the air nozzle.

12. The cleaning method according to claim 9, wherein the ultrasonic wave is generated by a diaphragm disposed in the air nozzle.

13. The cleaning method according to claim 9, wherein the ultrasonic wave is generated by a vibrator which is rotated in a chamber disposed in the air nozzle.

14. The cleaning method according to claim 9, wherein said air nozzle is located about 5 to 10 mm from said cleaning surface, said high pressure air is blown from said air nozzle at about a spouting pressure of 3 to 5 kg per square centimeter at a spouting velocity of about 25 to 30 m/s.

15. The cleaning method according to claim 9, wherein said air guide wall surface is a semicircle-like guide wall projecting toward said air nozzle.

16. The cleaning method according to claim 9, wherein the air guide section has the air guide wall surface of a circular arc for generating an air flow along said air guide wall into said exhaust introducing passage.

17. The cleaning apparatus according to claim 9, wherein the air guide section has the air guide wall surface of a circular arc for generating an air flow along said air guide wall into said exhaust introducing passage.

18. A cleaning apparatus comprising:
an air nozzle spraying high pressure air obliquely onto a cleaning surface to remove deposits on said cleaning surface by the high pressure air from then air nozzle disposed in the vicinity of said cleaning surface of a cleaning object at an angle and distance to clean said cleaning surface with said high pressure air;
an air guide section, disposed in front of an outlet port of said air nozzle, and an air guide section having an air guide wall surface for recovering substantially all of the air containing the removed deposits from said cleaning object by causing said air to exhaust, using a Coanda effect, into an exhaust introducing passage defined by an air cover section, along an air guide wall surface of an air guide section without exhausting the air and the removed deposit to surroundings; allowing the exhaust of the air containing the deposit that is removed by spraying from the air nozzle onto the cleaning surface into the exhaust introducing passage along the air guide wall surface without a need for an external vacuum source for said exhaust introducing passage;
ultrasound generating means for applying an ultrasonic wave to said high pressure air to be sprayed onto said cleaning object; and
static electricity eliminating means, provided in the vicinity of said cleaning surface, for eliminating static electricity charged on said cleaning surface.

19. The cleaning apparatus according to claim 18, wherein said air guide wall surface is a semicircle-like guide wall projecting toward said air nozzle.

* * * * *